Oct. 29, 1968 N. S. NISHIOKA 3,408,589

OVERLOAD PROTECTION CIRCUIT FOR TRANSISTOR AMPLIFIER

Filed Sept. 18, 1964

2 Sheets-Sheet 1

NORMAN S. NISHIOKA
INVENTOR.

BY Albert Rosen
Fraser and Bogucki
ATTORNEYS

Oct. 29, 1968 N. S. NISHIOKA 3,408,589

OVERLOAD PROTECTION CIRCUIT FOR TRANSISTOR AMPLIFIER

Filed Sept. 18, 1964

2 Sheets-Sheet 2

NORMAN S. NISHIOKA
INVENTOR.

BY Albert Rosen
Fraser and Bogucki
ATTORNEYS

United States Patent Office 3,408,589

Patented Oct. 29, 1968

3,408,589
OVERLOAD PROTECTION CIRCUIT FOR TRANSISTOR AMPLIFIER

Norman S. Nishioka, Downey, Calif., assignor to California Computer Products, Inc., Anaheim, Calif., a corporation of California Filed Sept. 18, 1964, Ser. No. 397,418
3 Claims. (Cl. 330—51)

Figure 1:
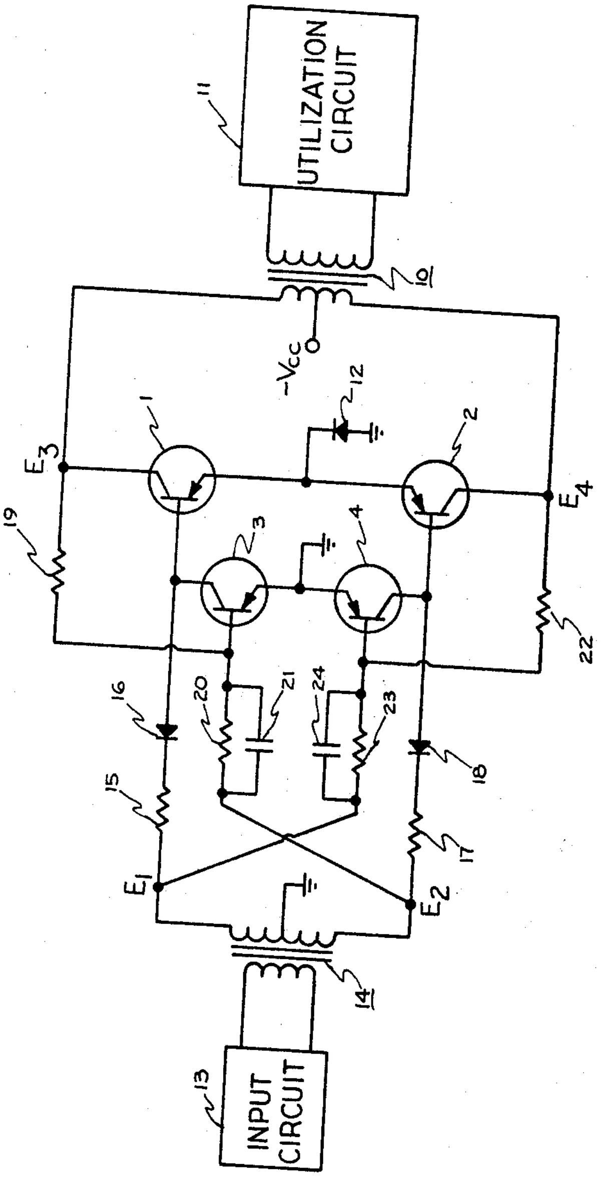

This invention relates to transistor amplifiers and more specifically to transistor amplifiers employing overload protection circuitry.

In recent years, transistors have been widely employed in many electrical circuit applications. One such application is that of square or rectangular wave amplification. When transistors are so used, it is frequently desirable that they operate in the so-called switching mode, so that they may perform such functions as converting D-C to an A-C square wave. When so operated, the transistor of transistors comprising the active elements of the amplifier switch between two conductive states—one state being termed the "on" state and the other the "off," state. Generally, the "on" state corresponds to that region wherein the collector electrode is drawing saturation current, and the "off" state corresponds to the region in which the transistor is cut off.

It is well known that the junctions in transistors are subject to damage and even destruction if the power dissipated therein is excessive. The output transistors of transistor amplifier circuits are particularly prone to such failure due to the relatively high power levels encountered even under normal operating conditions. Normally, when operated in the switching mode, an output transistor of such an amplifier will not dissipate excessive power. This can be seen by considering the fact that when the transistor is "on" or in saturation, the collector current may be high, but the collector-to-emitter voltage is relatively low, and in the "off" state the collector-to-emitter voltage may be high, but the collector current is substantially zero. In either case the power dissipation in the transistor junction is maintained within the maximum dissipation limit of the transistor. During the transition between the "on" and "off" states excess power dissipation could occur were it not for the fact that such transition is, in general, very rapid. It may happen, however, under adverse conditions, that the transistor may be drawn out of its low dissipation cut-off or saturation regions into the class-A region in which the current and voltage are both relatively high. Excessive loads, short circuits or a lowered drive frequency can cause excessive dissipation within the transistor. When this occurs, the transistor may be damaged or destroyed. In the past, fuses or other temperatture responsive devices have been utilized to prevent transistor damage. In many applications, however, such devices have proved unsuccessful due to their relatively slow response times.

It is therefore a general object of the present invention to protect the output transistors of an amplifier operating in the switching mode from excessive power dissipation brought about by adverse operating conditions.

Another object of this invention, is to increase the speed and reliability of transistor protection circuits.

In accordance with the teachings of the present invention, the above objects are accomplished by employing auxiliary switching elements which remove the base biasing current of the amplifier output transistors when their collector voltages exceed a predetermined threshold level. In a preferred embodiment a transistor switch is connected between the base electrode of each amplifier output transistor and ground potential. Under normal operating conditions the auxiliary transistor switches do not affect the operation of the amplifier. However, should one of the output transistors move out of the saturation region into its high-dissipation class-A region, the auxiliary transistor switch turns on regeneratively thereby shorting the base of the output transistor to ground and causing it to turn off before damage can occur.

Figure 2:
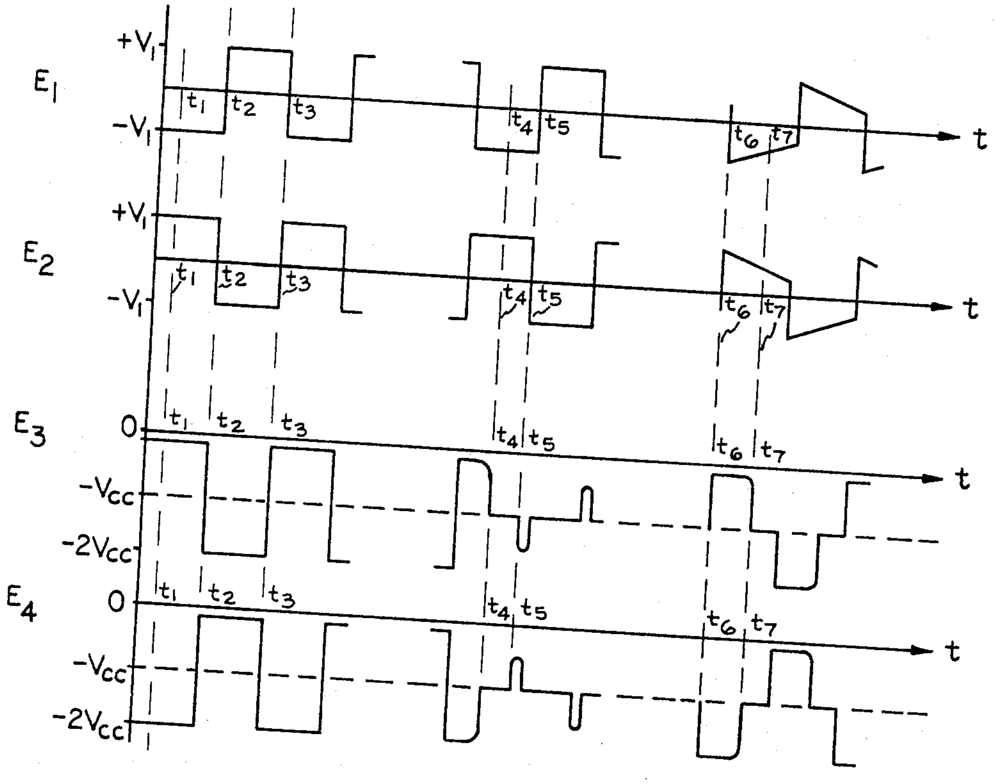

The foregoing and other objects and features of the present invention may be more fully understood from the following detailed description taken in conjunction with the attached drawings, in which:

FIG. 1 is a schematic diagram of a preferred embodiment of the present invention; and FIG. 2 is a graphical representation of the voltage waveforms at various points within the embodiment of FIG. 1 under different operating conditions.

Referring more specifically to the drawings, FIG. 1 is a schematic diagram of an exemplification of a circuit in accordance with the present invention. The circuit of FIG. 1 includes a pair of semiconductor amplifying devices 1 and 2, shown herein as PNP junction-type transistors, connected in the manner of a push-pull power amplifier. The collector electrodes of output transistors 1 and 2 are connected through output transformer 10 to a utilization circuit depicted by block 11. The direct-current collector supply voltage $V_{cc}$ to output transistors 1 and 2 is provided through the centertapped primary winding of output transformer 10. The emitter electrodes of output transistors 1 and 2 are connected to a common or ground potential through a nonlinear conducting device 12 such as a semiconductor diode.

The input signal to be amplified is provided by an input circuitry 13 which can comprise an oscillator, another amplifier, or other source of input signals. Coupling between input circuit 13 and the amplifier circuit is provided by input transformer 14. A first end of the secondary winding of input transformer 14 is connected to the base electrode of transistor 1 through a serially connected resistor 15 and nonlinear conducting device 16. The second end of the secondary winding of transformer 14 is connected in a similar manner through resistor 17 and nonlinear conducting device 18 to the base of transistor 2. A direct-current return path is provided through the secondary winding of input transformer 14 by means of a centertapped connection to ground.

A pair of auxiliary switching devices 3 and 4 also shown as PNP junction transistors are connected in a push-pull arrangement between the base electrodes of output transistors 1 and 2. More specifically, the collectors of auxiliary transistors 3 and 4 are connected to the base electrodes of output transistors 1 and 2, respectively, while their emitters are connected to ground. The base electrode of auxiliary transistor 3 is connected through a resistor 19 to the collector of output transistor 1 and to the second end of the secondary winding of input transformer 14 through a passive network comprising the parallel combination of a resistor 20 and capacitor 21. In a similar manner, the base electrode of auxiliary transistor 4 is connected through a resistor 22 to the collector of output transistor 2 and to the first end of the secondary winding of input transformer 14 through the parallel combination of a resistor 23 and capacitor 24.

The operation of the circuit of FIG. 1 can be readily described with reference to FIG. 2 which is a graphical representation of the voltage waveforms occurring at selected points in the circuit. The waveforms designated $E_1$ and $E_2$ represent the voltages at the first and second ends of the secondary winding of input transformer 14, respectively, with ground potential taken as zero reference. Waveforms $E_3$ and $E_4$ represent the voltages appearing at the collectors of output transistors 1 and 2, respectively. The voltage waveforms of FIG. 2 are all drawn to the same time scale although, for the sake of clarity, the vertical scale of waveforms $E_1$ and $E_2$ is different than that of $E_3$ and $E_4$.

Under normal operating conditions at time $T_1$, the voltage at point $E_1$ is equal to $-V_1$ and that at $E_2$ is $+V_1$. Output transistor 1 is in its "on" state, that is, it is biased to saturation due to the negative potential at its base electrode. The voltage $E_3$ at the collector of output transistor 1 is therefore only slightly less than zero (that is, $E_3$ is equal to the collector-to-emitter voltage drop plus the voltage drop across nonlinear conducting device 12). The other output transistor 2 is in its "off" state and its collector potential $E_4$ is substantially equal to $-2V_{CC}$.

As a consequence of these conditions, it is seen that auxiliary transistor 3 is in its "off" state due to the positive biasing potential at its base electrode derived from the voltage divider action of resistors 19 and 20. Auxiliary transistor 4, on the other hand, is in its "on" state by virtue of the negative potential at its base electrode obtained through the voltage divider action of resistors 22 and 23. Nonlinear conducting device 18 serves to block the positive voltage $+V_1$ at point $E_2$ from the base electrode of output transistor 2. Auxiliary transistor 4 thus provides a low impedance path to ground for the base-to-collector leakage current of output transistor 2. A small cut-off bias potential to output transistor 2 is insured by the emitter voltage generated by the small voltage drop across nonlinear conducting device 12.

At time $T_2$ the input signal changes phase and the voltage at point $E_1$ changes from $-V_1$ to $+V_1$. The voltage at point $E_2$ undergoes a negative transition to $-V_1$, which voltage causes auxiliary transistor 3 to revert to its "on" state thereby placing the base of output transistor 1 at substantially ground potential and causing it to switch off. The positive voltage $+V_1$ at point $E_1$ is coupled through capacitor 24 to the base of auxiliary transistor 4, thereby overcoming the negative potential derived from point $E_4$ through resistor 22. Auxiliary transistor 4, as a consequence, is turned off momentarily. During the time when auxiliary transistor 4 is "off" the negative potential $-V_1$ at point $E_2$ is applied through resistor 17 and nonlinear conducting device 18 to the base of output transistor 2 thereby turning it on. If auxiliary transistor 4 is pulsed off for a time sufficient to allow output transistor 2 to reach saturation, then transistor 2 will remain in its "on" state for the remainder of the half cycle. This is apparent from the fact that when output transistor 2 is "on" its collector voltage $E_4$ drops to near zero potential, and auxiliary transistor 4 is biased off by the positive potential at its base. At time $T_3$ the input signal again changes phase and the switching process is repeated.

The operation of the circuit under overload conditions can be explained by first assuming that at time $T_4$ the load current at utilization circuit 11 becomes excessive through a decrease in load resistance or a short circuit. At this moment output transistor 1 is "on" and is conducting saturation current. The increased load current in the secondary of output transformer 10 is reflected back through its primary winding causing output transistor 1 to come out of its saturation region. The collector voltage $E_3$ thus increases (that is, becomes more negative) which negative change is fed back to the base of auxiliary transistor 3 causing it to turn on. The turn-on of auxiliary transistor 3 is regenerative in that, as it is turned on the biasing current of output transistor 1 is partially shunted to ground. This, in turn, causes the collector voltage $E_3$ to become still more negative, and so on. The threshold level at which transistor 3 begins to turn on depends upon the characteristics of auxiliary transistor 3 and the relative resistances of resistors 19 and 20 as well as the value of $+V_1$.

At time $T_5$, when the next half cycle begins, the voltage of point $E_1$ makes a positive transition to $+V_1$ and point $E_2$ takes on a negative value $-V_1$. Output transistor 2 will attempt to turn on as under normal operating conditions, explained above, but because of the excessive load reflected through output transformer 10, output transistor 2 will not be able to reach its saturation level. Since the saturation level must be reached in order for auxiliary transistor 4 to remain "off" for the full half cycle, it will remain "on" thereby depriving output transistor 2 of its base current.

Under conditions of overload, therefore, output transistors 1 and 2 are protected from excessive collector current which might otherwise cause damage. Under these conditions, the circuit functions to sample the effective value of the load at the beginning of each half cycle to determine if it is still excessive. Should the load again become normal, the amplifier circuit will automatically revert to normal operation.

In view of the foregoing, it can be seen that resistors 19 and 20 and resistors 22 and 23 are advantageously proportioned so that the voltages at their junctions, that is, the base electrodes of auxiliary transistors 3 and 4, are just sufficient to begin to turn them on when the voltage at points $E_3$ or $E_4$ reaches its threshold level. Due to the symmetry of the embodiment of FIG. 1 the values of resistors 19 and 22 and 20 and 23, respectively, will generally be equal.

As mentioned above, capacitors 21 and 24 provide the capacitive coupling between input transformer 14 and the base electrodes of auxiliary transistors 3 and 4. The RC time constant of these capacitors and their associated resistors 19 and 20, and 22 and 23 determine the time at the beginning of each half cycle during which auxiliary transistors 3 and 4 are held "off." The duration of this "turn-off" time interval is governed by several factors. First, the minimum time interval is determined by the magnitude of the collector supply voltage $V_{cc}$, the minimum value of $V_1$, the inherent "turn-off" times of auxiliary transistors 3 and 4, and the inherent "turn-on" times of output transistors 1 and 2. Secondly, the maximum time interval is determined by the maximum permissible peak power dissipation that output transistors 1 and 2 can safely withstand.

If the effective load presented by utilization circuit 11 is normal, but the frequency of the input signal derived from input circuit 13 decreases, output transistors 1 and 2 can again be subjected to excessive power dissipation. For example, if the low frequency response of input transformer 14 is poor, the voltage appearing at its secondary at points $E_1$ and $E_2$ "droops" at its trailing edges somewhat as shown by the waveforms in FIG. 2 beginning at time $T_6$. When the magnitude of the input signal becomes too low the output transistor which is biased to saturation (at time $T_6$ this corresponds to output transistor 1) will start to move into its high-dissipation class-A region because of decreased base drive current. The same is true if output transformer 10 has a poor low frequency response characteristic. In FIG. 2 the time at which this happens corresponds to $T_7$. In either case, when the collector voltage $E_3$ of output transistor 1 reaches the threshold level auxiliary transistor 3 will be turned on regeneratively as previously explained. As auxiliary transistor 3 is turned on, output transistor 1 is turned off before damaging power dissipation can occur.

In all cases it is understood that the above-described arrangement is merely illustrative of one of the many embodiments of the present invention. Numerous and varied other arrangements can be readily devised by those skilled in the art without departing from the spirit and scope of the invention, the scope of which is defined by the appended claims.

I claim:

1. An amplifier comprising, in combination, a pair of output transistors, each of said transistors having an emitter, a collector and a base electrode, means for applying a rectangular wave input signal to the base electrodes of said transistors in opposite phase, means for coupling said emitter electrodes to a common junction, means for applying a direct-current supply voltage to said collector electrodes, a pair of auxiliary switching transistors, each having base and collector electrodes respectively coupled to the collector and base electrodes of a different one of the output transistors and an emitter electrode coupled to said common junction, each of said auxiliary switching transistors being operative to switch the associated output transistor into a state of nonconduction whenever the voltage at the collector electrode of the associated output transistor exceeds a predetermined threshold level, and means coupled to the collector electrodes of said output transistors for providing an amplified output voltage.

2. A signal amplifier operating in the switching mode comprising, in combination, a pair of output transistors, each of said transistors having an emitter, a collector and a base electrode, first circuit means connecting said transistors in push-pull relation, said first circuit means including an output transformer having a centertapped primary winding and a secondary winding, means coupling first and second ends of said centertapped primary winding to the collector electrodes of respective ones of said output transistors, a direct-current collector supply source connected between said primary center-tap and a common junction, a utilization circuit connected to said secondary winding, nonlinear conductance means for connecting said emitter electrodes to said common junction, a source of rectangular wave input signals, second circuit means for coupling said input signals to said base electrodes in phase opposition, said second circuit means including an input transformer having a primary winding and a centertapped secondary winding, means for connecting said secondary center-tap to said common junction, and a pair of switching devices coupled to the collector electrodes of respective ones of said transistors and operative to switch the associated transistor into a state of nonconduction whenever the voltage at the collector electrode of the associated transistor exceeds a predetermined threshold level, each of said switching devices comprising a transistor having an emitter electrode coupled to said common junction, a base electrode coupled to the collector electrode of the associated transistor, and a collector electrode coupled to the base electrode of the associated transistor.

3. A signal amplifier operating in the switching mode and comprising, in combination, a pair of output transistors, each of said transistors having an emitter, a collector and a base electrode, first circuit means connecting said transistors in push-pull relation, said first circuit means including an output transformer having a centertapped primary winding and a secondary winding, a direct-current collector supply source connected between said primary center-tap and a common junction, a utilization circuit connected to said secondary winding, nonlinear conductance means for connecting said emitter electrodes to said common junction, a source of rectangular wave input signals, second circuit means for coupling said input signals to said base electrodes, in phase opposition, said second circuit means including an input transformer having a primary winding and a centertapped secondary winding, means for connecting said secondary centertap to said common junction, means for coupling first and second ends of said secondary winding to the bases of said first and second output transistors respectively, a pair of auxiliary transistors, each having an emitter, a collector and a base electrode, said auxiliary transistors being connected in push-pull relation and the junction thereof being to said common junction, the collector of a first of said auxiliary transistors being connected to the base of a first of said output transistors and the collector of the second of said auxiliary transistors being connected to the base of the second of said output transistors, a pair of passive circuit means, each including a resistor-capacitor combination, a first of the passive circuit means coupling the first end of said secondary winding of said input transformer to the base of said second auxiliary transistor, a second of the passive circuit means coupling the second end of said second winding of said input transformer to the base of said first auxiliary transistor, and resistive means coupling the collector of said first output transistor to the base of said first auxiliary transistor, and the collector of said second output transistor to the base of said second auxiliary transistor, the values of the elements of said passive circuit means and said resistive means being selected to render the auxiliary transistors individually conducting after a selected time interval when the voltage level of the coupled collector reaches a selected threshold.

References Cited

UNITED STATES PATENTS 3,305,733 2/1967 Jahn ........ 330—15 X

FOREIGN PATENTS 154,589 10/1963 U.S.S.R.

ROY LAKE, *Primary Examiner.*

NATHAN KAUFMAN, *Assistant Examiner.*